United States Patent
Nitta et al.

(10) Patent No.: US 10,978,588 B2
(45) Date of Patent: Apr. 13, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Shunsuke Nitta, Hakusan Ishikawa (JP); Takeru Matsuoka, Himeji Hyogo (JP); Hiroshi Ohta, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/810,390

(22) Filed: Mar. 5, 2020

(65) Prior Publication Data

US 2021/0066497 A1    Mar. 4, 2021

(30) Foreign Application Priority Data

Sep. 4, 2019   (JP) .............................. JP2019-160939

(51) Int. Cl.
*H01L 29/78*     (2006.01)
*H01L 21/8234*   (2006.01)
(Continued)

(52) U.S. Cl.
CPC .. *H01L 29/7827* (2013.01); *H01L 21/823456* (2013.01); *H01L 21/823487* (2013.01);
(Continued)

(58) Field of Classification Search
CPC ............. H01L 29/7827; H01L 29/0692; H01L 29/4238; H01L 29/7813; H01L 21/823456; H01L 21/823487
(Continued)

(56) References Cited

U.S. PATENT DOCUMENTS

| 6,841,835 B2 | 1/2005 | Miyamoto |
| 10,115,700 B2 | 10/2018 | Fujita et al. |
| 2013/0069150 A1* | 3/2013 | Matsuoka ......... H01L 29/42376 257/330 |

FOREIGN PATENT DOCUMENTS

| JP | 3090132 U | 11/2002 |
| JP | 2014-2092 A | 1/2014 |
| WO | 2016-147243 A1 | 9/2016 |

* cited by examiner

*Primary Examiner* — Igwe U Anya (74) *Attorney, Agent, or Firm* — White & Case LLP (57) ABSTRACT

A semiconductor device includes a semiconductor part between first and second electrodes, first and second control electrodes between the semiconductor part and the second electrode. The semiconductor part includes a first region and a second region around the first region. The semiconductor part includes first and third layers of a first conductivity type and second layers of a second conductivity type. The second layers are provided between the first layer and the second electrode. A second layer faces the first control electrode in the second region. Another second layer faces the second control electrode in the second region. A third layer is provided between the second layer and the second electrode. Another third layer is provided between another second layer and the second electrode. The second layer includes a second conductivity type impurity with a concentration lower than that of a second conductivity type impurity in another second layer.

12 Claims, 7 Drawing Sheets

(51) Int. Cl.
*H01L 29/423* (2006.01)
*H01L 29/06* (2006.01)

(52) U.S. Cl.
CPC ...... *H01L 29/0692* (2013.01); *H01L 29/4238* (2013.01); *H01L 29/7813* (2013.01)

(58) Field of Classification Search
USPC ........................................................ 257/330
See application file for complete search history.

SEMICONDUCTOR DEVICE

CROSS-REFERENCE TO RELATED APPLICATIONS

This application is based upon and claims the benefit of priority from Japanese Patent Application No. 2019-160939, filed on Sep. 4, 2019; the entire contents of which are incorporated herein by reference.

FIELD

Embodiments relate to a semiconductor device.

BACKGROUND

A semiconductor device for power control is preferably used under an operating condition with redundancy to enhance the reliability, for example, used in a safe operating area. However, there are some problems to be solved for setting the safe operating area widely.

DETAILED DESCRIPTION

According to one embodiment, a semiconductor device includes a semiconductor part, first and second electrodes and a plurality of control electrodes. The first electrode is provided on the semiconductor part. The semiconductor part is provided between the first and second electrodes. The control electrode is provided between the semiconductor part and the second electrode. The control electrodes each are electrically isolated from the semiconductor part by a first insulating film. The control electrodes each are electrically isolated from the second electrode by a second insulating film. The second electrode includes a center portion and a peripheral portion, the peripheral portion being provided at an outer side of the center portion in a direction along a surface of the semiconductor part. The semiconductor part includes a first region and a second region, the first region being provided between the first electrode and the center portion of the second electrode, the second region being provided between the first electrode and the peripheral portion of the second electrode. The control electrodes include first and second control electrodes, the first control electrode being provided between the center portion of the second electrode and the first region of the semiconductor part, the second control electrode being provided between the peripheral portion of the second electrode and the second region of the semiconductor part. The semiconductor part includes a first semiconductor layer of a first conductivity type, a second semiconductor layer of a second conductivity type in the first region, another second semiconductor layer of the second conductivity type in the second region, a third semiconductor layer of the first conductivity type in the first region, and another third semiconductor layer of the first conductivity type in the second region. The second semiconductor layer is provided between the first semiconductor layer and the second electrode, the second semiconductor layer facing the first control electrode with a first insulating film interposed. Said another second semiconductor layer is provided between the first semiconductor layer and the second electrode, said another second semiconductor layer facing the second control electrode with another first insulating film interposed. The third semiconductor layer is selectively provided between the second semiconductor layer and the second electrode, the third semiconductor layer contacting the first insulating film. Said another third semiconductor layer is selectively provided between said another second semiconductor layer and the second electrode, said another third semiconductor layer contacting said another first insulating film. The second semiconductor layer includes a second conductivity type impurity with a concentration lower than a concentration of a second conductivity type impurity in said another second semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1A:
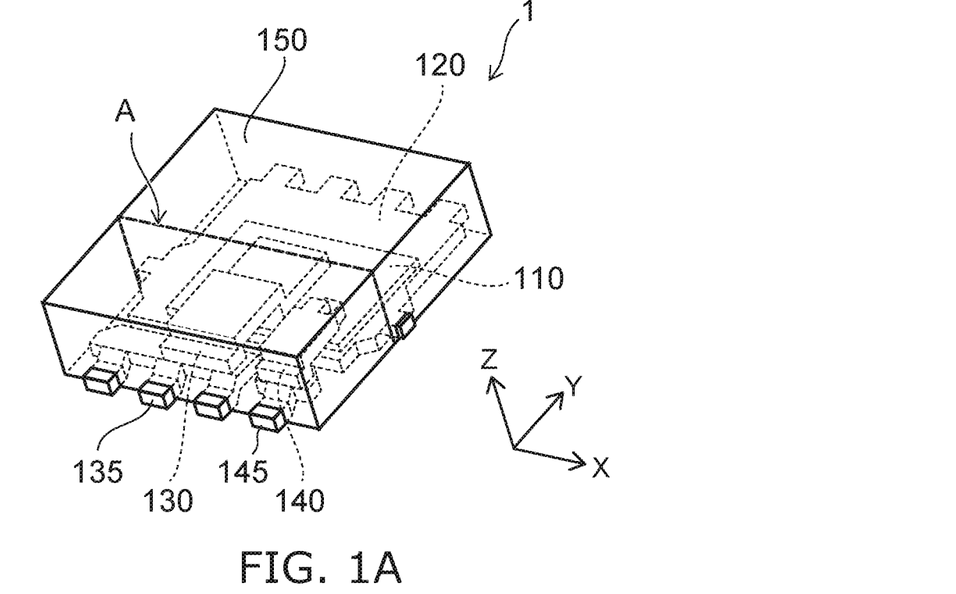
FIGS. 1A and 1B are schematic views showing a semiconductor device according to an embodiment.
Figure 1B:
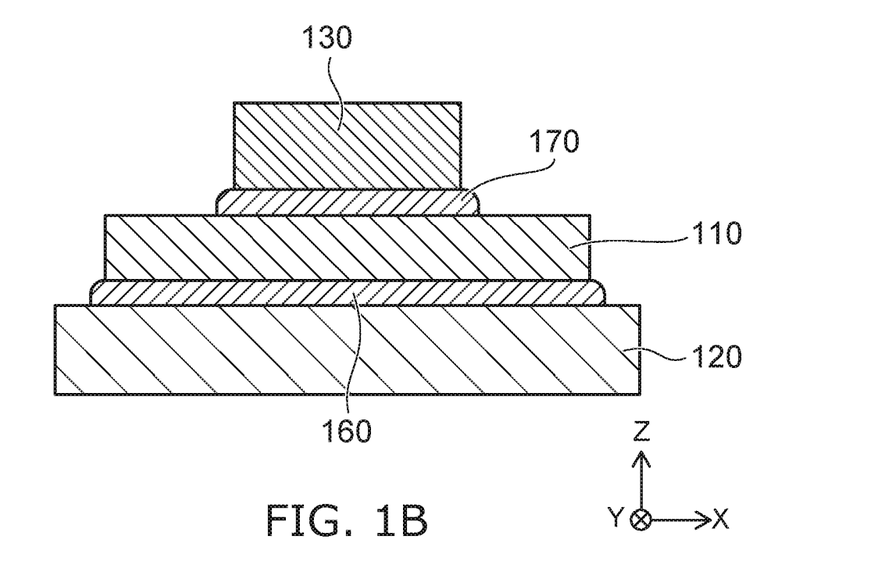

FIGS. 1A and 1B are schematic views showing a semiconductor device 1 according to an embodiment. FIG. 1A is a perspective view showing the semiconductor device 1. FIG. 1B is a schematic view showing cross section along a broken line A in FIG. 1A.

As shown in FIG. 1A, the semiconductor device 1 includes a semiconductor chip 110, a mounting base 120, a source connector 130, and a gate connector 140. The semiconductor chip 110 is, for example, MOSFET. The semiconductor chip 110 is provided on the mounting base 120.

The semiconductor device 1 further includes a source terminal 135, a gate terminal 145 and a resin package 150. The source terminal 135 is electrically connected to the source electrode of the semiconductor chip 110 through the source connector 130, for example. The gate terminal 145 is electrically connected to the gate pad of the semiconductor chip 110 through the gate connector 140, for example.

The resin package 150 is formed to cover the semiconductor chip 110, the mounting base 120, the source connector 130, and the gate connector 140, for example. The source terminal 135 and the gate terminal 145 are provided so that a portion of the source terminal 135 extends from the resin package 150. Further, the mounting base 120 is provided so that a portion of the mounting base 120 (not shown) extends from the resin package 150 as a drain terminal, for example.

As shown in FIG. 1B, the semiconductor chip 110 is providing on the mounting base 120 via the connection member 160. The mounting base 120 is a metal member with plate like shape, and includes, for example, copper or copper alloy. The connection member 160 is, for example, a solder material.

The source connector 130 is bonded to the semiconductor chip 110 via the connection member 170. The source connector 130 is a metal member with a plate like shape, and includes, for example, copper or copper alloy. The connection member 170 is, for example, a solder material.

Figure 2A:
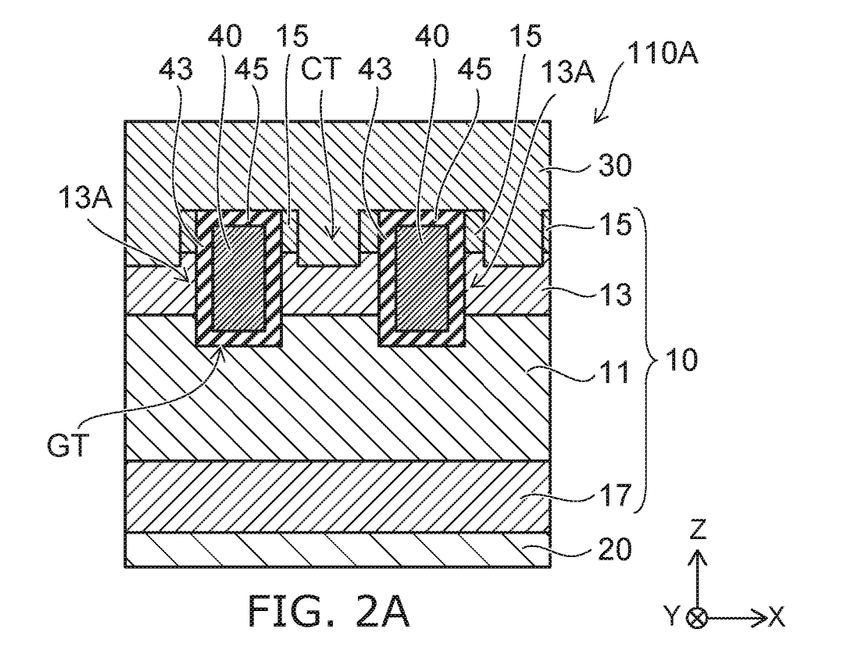
FIGS. 2A to 2C are schematic cross-sectional views showing the semiconductor device according to the embodiment.
Figure 2B:
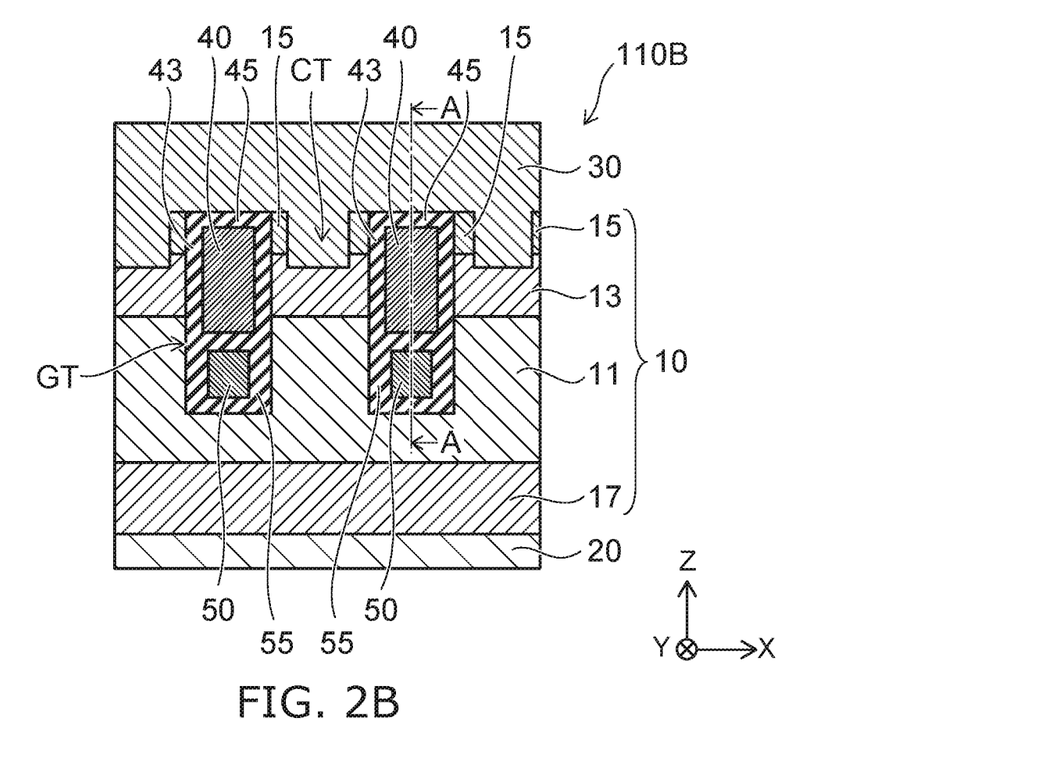
Figure 2C:
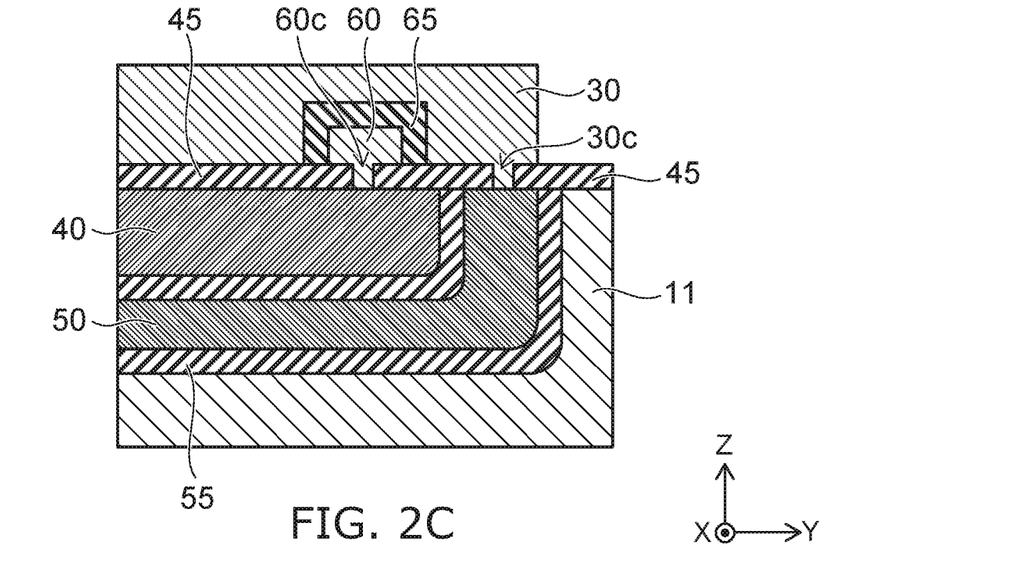

FIGS. 2A to 2C are schematic cross-sectional views showing the semiconductor device 1 according to the embodiment. FIG. 2A is a schematic view showing cross section of a semiconductor chip 110A. FIG. 2B is a schematic view showing cross section of a semiconductor chip 110B. FIG. 2C is a cross-sectional view of the semiconductor chip 110B taken along A-A line in FIG. 2B. The semiconductor device 1 may include the semiconductor chip 110A or 110B.

As shown in FIG. 2A, the semiconductor chip 110A includes a semiconductor part 10, a drain electrode 20, a source electrode 30 and a gate electrode 40. The semiconductor part 10 is, for example, silicon. The drain electrode 20 is a metal layer including, for example, gold, nickel, germanium or the like. The source electrode 30 is a metal layer including, for example, tungsten or aluminum or the like.

The drain electrode 20 is provided on the back surface of the semiconductor part 10, for example. The source electrode 30 is provided on the front surface of the semiconductor part 10. The gate electrode 40 is provided between the semiconductor part 10 and the source electrode 30.

The gate electrode 40 is provided, for example, in the gate trench GT. The gate trench GT is provided at the front surface side of the semiconductor part 10. The gate electrode 40 is electrically isolated from the semiconductor part 10 by an insulating film 43. The gate electrode 40 is electrically isolated from the source electrode 30 by an insulating film 45. The gate electrode 40 is a conductor including, for example, polysilicon. The insulating film 43 and the insulating film 45 are, for example, silicon oxide films.

The semiconductor part 10 includes, for example, an n-type drift layer 11, a p-type diffusion layer 13, an n-type source layer 15 and an n-type drain layer 17. The n-type drift layer 11 extends in the X-direction and the Y-direction along the back surface of the semiconductor part 10. The n-type drift layer 11 extends entirely in the semiconductor part 10.

The p-type diffusion layer 13 is provided between the n-type drift layer 11 and the source electrode 30. For example, the p-type diffusion layer 13 is provided between the adjacent gate electrodes 40 in the X-direction. The p-type diffusion layer 13 includes a channel portion 13A that faces the gate electrode 40 with the insulating film 43 interposed.

The n-type source layer 15 is selectively provided between the p-type diffusion layer 13 and the source electrode 30. The n-type source layer 15 is provided to be in contact with the insulating film 43. The n-type source layer 15 includes an n-type impurity with a concentration higher than a concentration of the n-type impurity in the n-type drift layer 11.

The n-type drain layer 17 is provided between the n-type drift layer 11 and the drain electrode 20. The n-type drain layer 17 includes an n-type impurity with a concentration higher than the concentration of the n-type impurity in the n-type drift layer 11. For example, the drain electrode 20 is in contact with the n-type drain layer 17, and electrically connected thereto.

As shown in FIG. 2A, the source electrode 30 is in contact with the n-type source layer 15, and electrically connected thereto. Further, the source electrode 30 has a portion extending in the contact trench CT. For example, the contact trench CT extends through the n-type source layer 15, and reaches the p-type diffusion layer 13. The source electrode 30 is electrically connected to the p-type diffusion layer 13 in the contact trench CT.

The semiconductor chip 110B shown in FIG. 2B further includes a source plate 50 provided in the gate trench GT. The source plate 50 is provided between the gate electrode 40 and the drain electrode 20. The source plate 50 is provided in the n-type drift layer 11, and is electrically isolated from the n-type drift layer 11 by the insulating film 55. The source plate 50 is a conductor including, for example, polysilicon. The insulating film 55 is, for example, a silicon oxide film.

As shown in FIG. 2C, the gate electrode 40 is electrically connected to a gate interconnect 60 through a connection portion 60c thereof. The gate interconnect 60 is electrically isolated from the source electrode 30, for example, by an insulating film 65. The gate interconnect 60 extends along the semiconductor part 10, and is connected to, for example, a gate pad (not shown). The source plate 50 is electrically connected to the source electrode 30 through the connection portion 30c. The source plate 50 has an end extending upward, and is connected to the source electrode 30 at the end thereof.

Figure 3A:
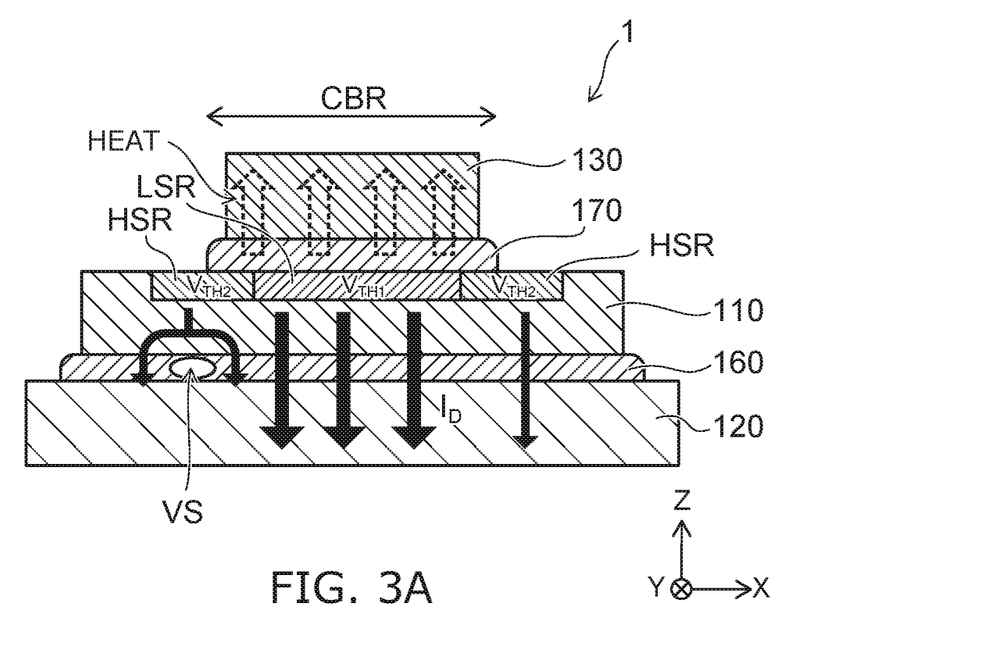
FIG. 3A is a schematic view showing characteristics of the semiconductor device according to the embodiment.
Figure 3B:
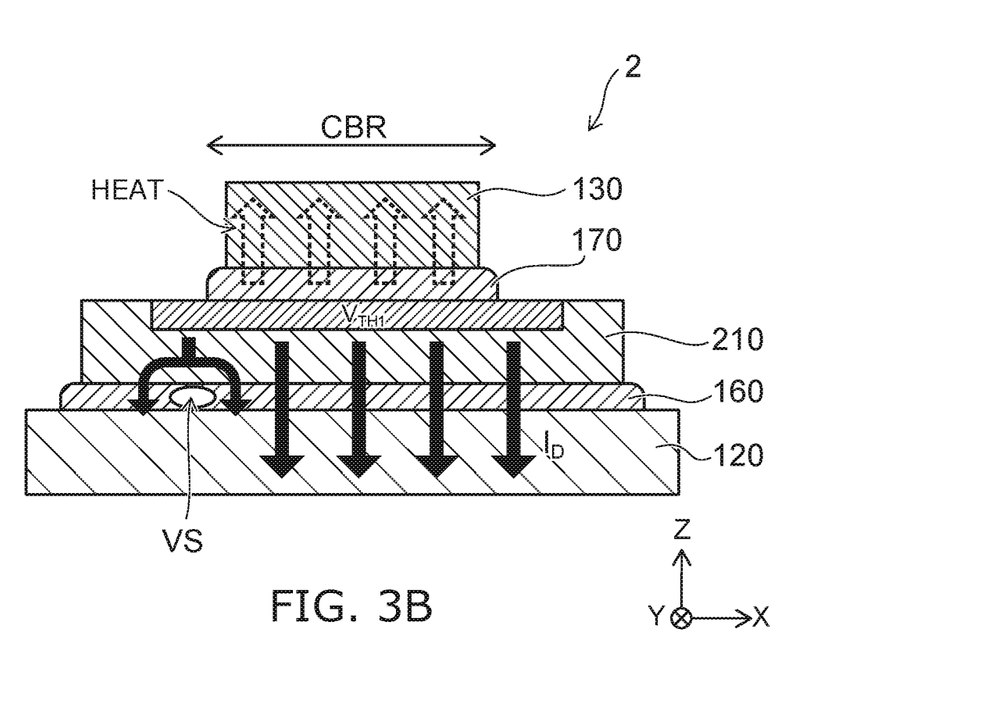
FIG. 3B is a schematic view showing characteristics of a semiconductor device according to a comparative example.

FIGS. 3A and 3B are schematic views showing characteristics of the semiconductor device 1 according to the embodiment. FIG. 3A is a schematic cross-sectional view showing the semiconductor device 1 according to the embodiment. FIG. 3B is a schematic cross-sectional view showing a semiconductor device 2 according to a comparative example.

The semiconductor chip 110 shown in FIG. 3A includes two regions (hereinafter, a low threshold region LSR and a high threshold region HSR) in which the threshold voltages of the gate electrode 40 (see FIG. 2A) are different from each other. The low threshold region LSR and the high threshold region HSR are provided, for example, at the front surface side of the semiconductor part 10. The gate electrode 40 provided in the high threshold region HSR has a threshold voltage $V_{TH2}$. The gate electrode 40 provided in the low threshold region LSR has a threshold voltage $V_{TH1}$ that is lower than the threshold voltage $V_{TH2}$.

For example, the p-type diffusion layer 13 (see FIG. 2A) is formed such that an impurity concentration in the low threshold region LSR is different from an impurity concentration in the high threshold region HSR. Thereby, the threshold voltages $V_{TH1}$ and $V_{TH2}$ can be achieved in the low threshold region LSR and the high threshold region HSR, respectively. That is, the p-type impurity concentration of the p-type diffusion layer 13 provided in the low threshold region LSR is lower than the p-type impurity concentration of the p-type diffusion layer 13 provided in the high threshold region HSR. For example, the p-type impurity concentration in the high threshold region HSR is 1.1 to 1.5 times the p-type impurity concentration in the low threshold region LSR.

The insulating film 43 (see FIG. 2A) may be formed such that a film thickness thereof in the X-direction in the low threshold region LSR is different from a film thickness thereof in the X-direction in the high threshold region HSR. Thereby, the threshold voltages $V_{TH1}$ and $V_{TH2}$ can be achieved in the low threshold region LSR and the high threshold region HSR. The insulating film 43 functions as a gate insulating film of the gate electrode 40. That is, the insulating film 43 is formed so that the film thickness in the low threshold region LSR is thinner than the film thickness in the high threshold region HSR.

For example, the low threshold region LSR is provided under a bonding region CBR in which the source connector 130 is bonded to the source electrode 30 (see FIG. 3A). For example, the connection member 170 is provided on the bonding region CBR. The high threshold region HSR is provided below a portion of the source electrode 30 outside the bonding region CBR. Further, as shown in FIG. 3A, a portion of the high threshold region HSR may be provided below the bonding region CBR.

The semiconductor device 2 illustrated in FIG. 3B includes a semiconductor chip 210. In the semiconductor chip 210, the gate electrode 40 is provided with the constant threshold voltage $V_{TH1}$. For example, in the process of turning the semiconductor device 2 from the on state to the off state (i.e., turn-off process), the drain current $I_D$ uniformly flows through the region in which the gate electrode 40 is provided.

Further, the turn-off process of the semiconductor device 2 includes a period in which the drain current $I_D$ continuously flows and the voltage between the source and drain electrodes increases. The heat amount generated inside the semiconductor chip 210 increases as the voltage increases between the source and drain electrodes. The heat generated in the semiconductor chip 210 is dissipated outside through, for example, the mounting base 120 and the source connector 130.

As shown in FIG. 3B, when a void defect VS is generated in the connection member 160 that is provided between the mounting base 120 and the semiconductor chip 210, the heat transfer from the semiconductor chip 210 to the mounting base 120 may be hindered. For example, when the void defect VS is provided between the mounting base 120 and the source connector 130 (not shown), the heat is dissipated through the source connector 130 from the semiconductor chip 210, and thus, the influence of the void defect VS on the heat conduction is mitigated.

However, when the void defect VS is provided between the portion of the source electrode 30 outside the bonding region CBR and the mounting base 120, the heat transfer is hindered by the void defect VS. That is, it is hard to dissipate the heat through the mounting base 120, and also hard to dissipate the heat through the source connector 130. Therefore, the temperature of the semiconductor chip 210 is locally raised at the region above the void defect VS, thereby making the threshold voltage lower at the gate electrode 40 provided therein. Thus, the drain current $I_D$ flowing through the region above the void defect VS may increase acceleratingly, resulting in the destruction of the semiconductor chip 210.

In the semiconductor device 1 shown in FIG. 3A, the drain current $I_D$ in the turn-off process is concentrated in the low threshold region LSR provided between the mounting base 120 and the source connector 130. In contrast, the drain current $I_D$ in the high threshold region HSR is suppressed. Thus, the local raise of temperature due to the void defect VS is suppressed in the semiconductor chip 110, thereby it is possible to avoid the accelerated increase of the drain current ID. As a result, it is possible in the semiconductor device 1 to prevent the destruction of the semiconductor chip 110, and make the safe operating area wider.

While the semiconductor device 1 is turned on, the gate voltage applied to the gate electrode 40 is larger than the threshold voltages $V_{TH1}$ and $V_{TH2}$. Therefore, the drain current $I_D$ flows in the high threshold region HSR with the same level as that in the low threshold region LSR in the ON state of the semiconductor device 1. That is, it is possible in the semiconductor device 1 to prevent the on-resistance from increasing, whereas the low threshold region LSR and the high threshold region HSR are provided with the different threshold voltages.

Figure 4A:
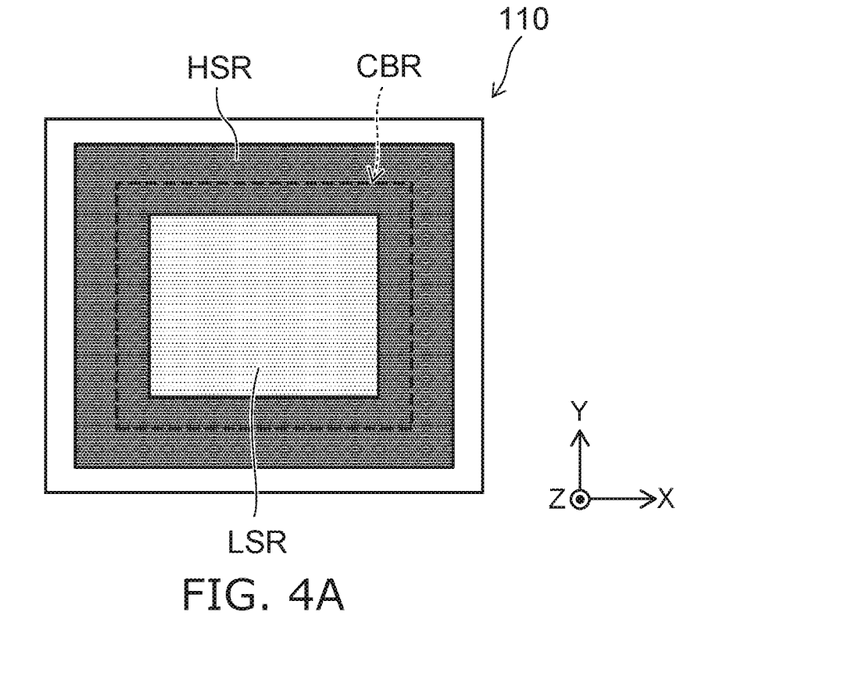
FIGS. 4A and 4B are schematic plan views showing the semiconductor devices according to the embodiment.
Figure 4B:
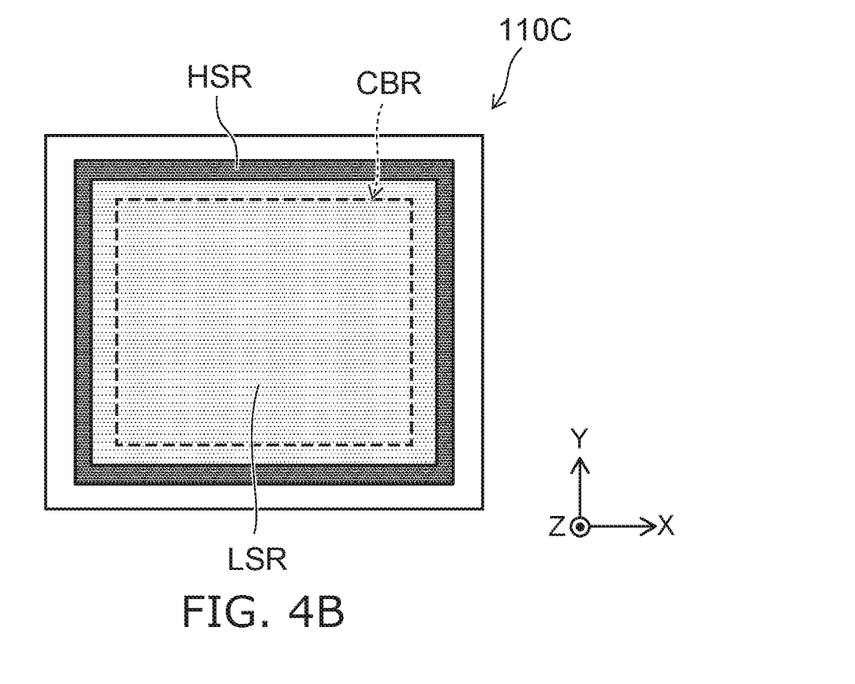

FIGS. 4A and 4B are schematic plan views showing the semiconductor devices 1 according to the embodiment. FIG. 4A is a schematic plan view showing the low threshold region LSR and the high threshold region HSR in the semiconductor chip 110. FIG. 4B is a schematic plan view showing the low threshold region LSR and the high threshold region HSR in a semiconductor chip 110C. The broken lines shown in FIGS. 4A and 4B show the periphery of the bonding region CBR.

As shown in FIG. 4A, the low threshold region LSR is provided in the center of the semiconductor chip 110. The high threshold region HSR is provided to surround the low threshold region LSR. Further, the low threshold region LSR is provided inside the bonding region CBR, and a portion of the high threshold region HSR is provided in the bonding region CBR.

In the semiconductor chip 110C shown in FIG. 48, the low threshold region LSR is provided outside the bonding region CBR as well as inside the bonding region CBR. The high threshold region HSR is provided outside the bonding region CBR so as to surround the low threshold region LSR.

Here, the bonding region CBR is described as a possible area on which the source connector 130 is bonded. The bonding region CBR is not necessarily coincident with the footprint of the source connector 130 that is actually bonded on the source electrode 30 via the connection member 170. For example, the connection member 170 is provided on the bonding region CBR, and the footprint of the source connector 130 may be smaller than the bonding region CBR.

Figure 5A:
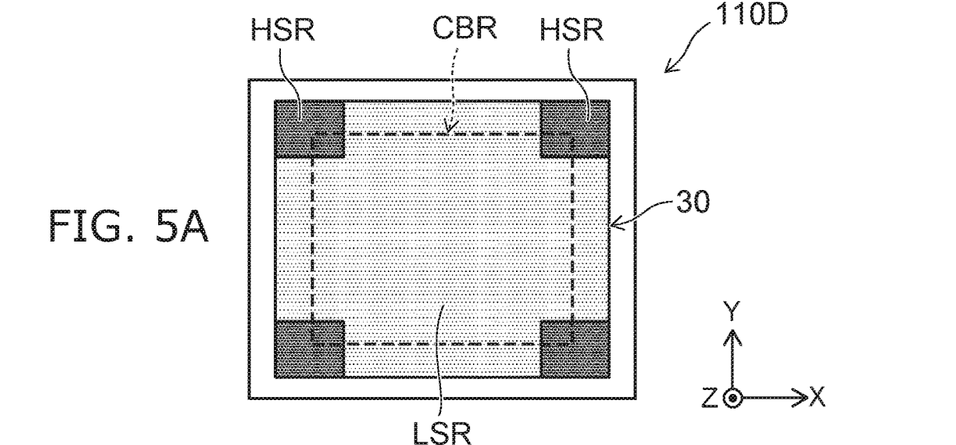
FIGS. 5A to 5C are schematic plan views showing a semiconductor device according to a modification of the embodiment.
Figure 5B:
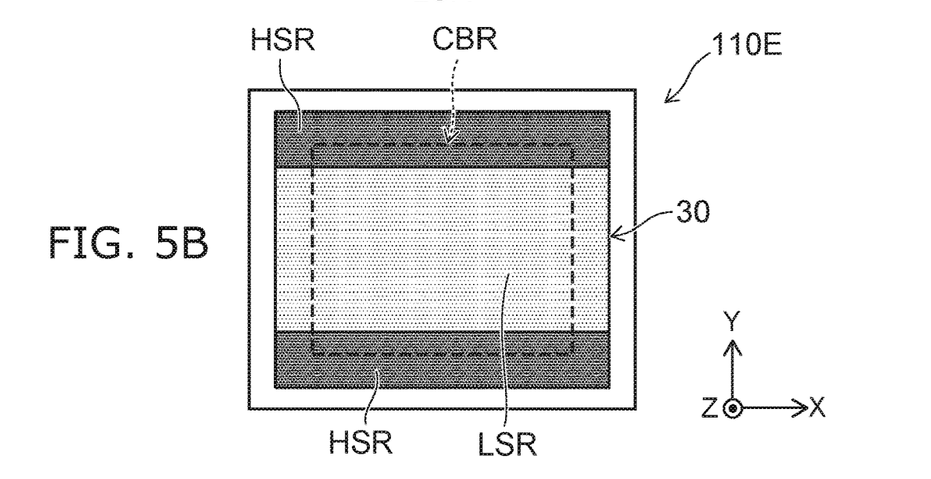
Figure 5C:
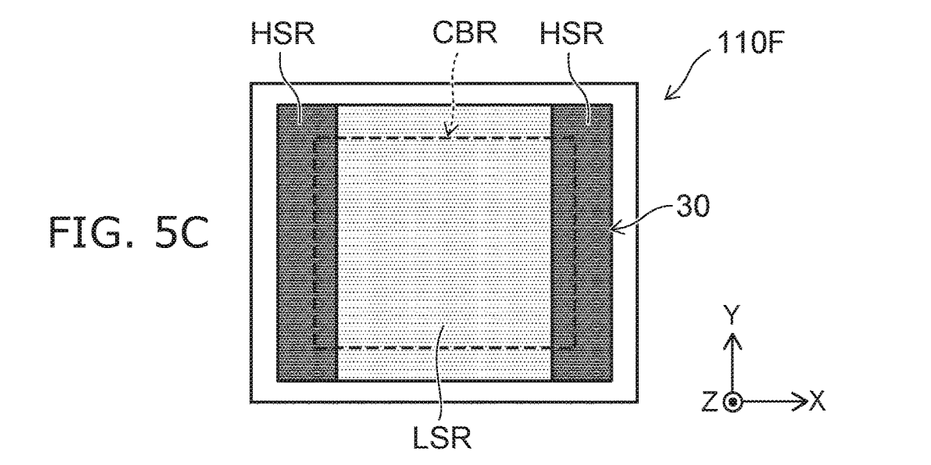

FIGS. 5A to 5C are schematic plan views showing semiconductor chips 110D to 110F of a semiconductor device according to a modification of the embodiment. FIGS. 5A to 5C are schematic views each showing an arrangement of the low threshold region LSR, the high threshold region HSR and the bonding region CBR. Here, the gate electrode 40 (see FIGS. 2A and 28) extends, for example, in the Y-direction.

In the semiconductor chip 110D shown in FIG. 5A, the high threshold region HSR is provided at the four corners of the bonding region CBR on the source electrode 30. The high threshold region HSR is not necessarily provided to surround the bonding region CBR, but is provided on an area where the void defect VS may be generated in the connection member 160 with high probability.

In the semiconductor chip 110E shown in FIG. 5B, the high threshold region HSR is provided along at least a side of the source electrode 30. For example, two high threshold regions HSR are provided, which extend in the X-direction, and the low threshold region LSR is provided between the two high threshold regions HSR.

In the semiconductor chip 110F shown in FIG. 5C, for example, two high threshold regions HSR are provided, which extend in the Y-direction along the sides of the source electrode 30. The low threshold region LSR is provided between the two high threshold regions HSR.

Figure 6:
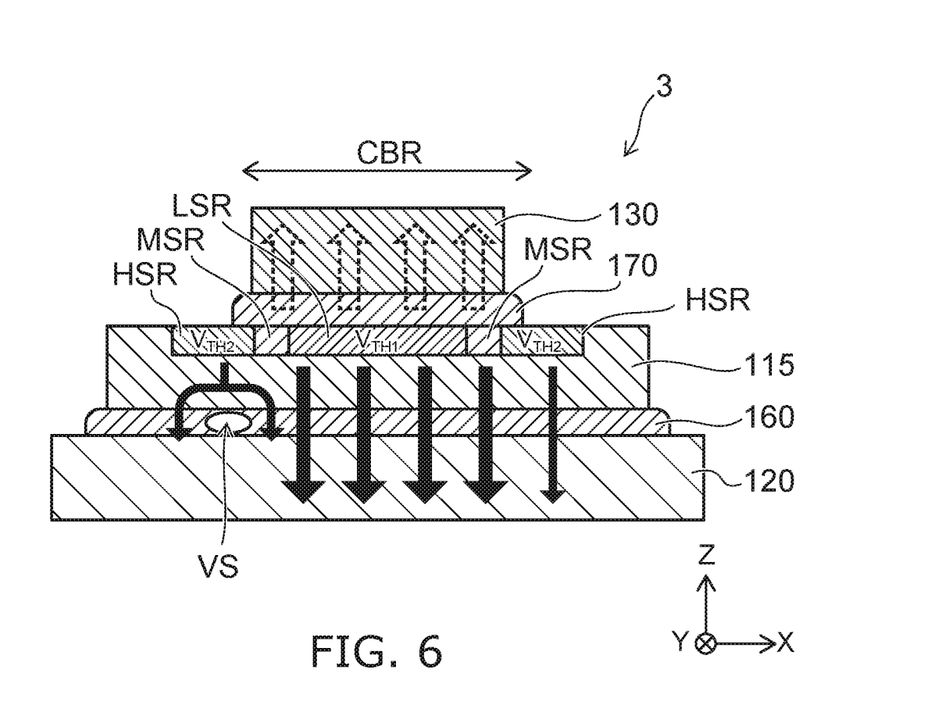
FIG. 6 is a schematic view showing a semiconductor device according to another modification of the embodiment.

FIG. 6 is a schematic view showing a semiconductor device 3 according to other modification of the embodiment. The semiconductor device 3 includes a semiconductor chip 115. The semiconductor chip 115 is provided on the mounting base 120 via the connection member 160.

The semiconductor chip 115 includes a low threshold region LSR, a high threshold region HSR and an intermediate region MSR. The gate electrode 40 in the low threshold region LSR has the threshold voltage $V_{TH1}$, and the gate electrode 40 in the high threshold region HSR has the threshold voltage $V_{TH2}$. A gate electrode 40 provided in the intermediate region MSR has an intermediate threshold voltage between $V_{TH1}$ and $V_{TH2}$.

In this example, the low threshold region LSR is also provided below the bonding region CBR on the source electrode 30. The high threshold region HSR is provided below a portion of the source electrode 30 outside the bonding region CBR. The intermediate region MSR is provided between the low threshold region LSR and the high threshold region HSR. Moreover, a part of the high threshold region HSR may be provided below the bonding region CBR as shown in FIG. 6.

Although several examples have been described above, the embodiments are not limited thereto. For example, the gate electrode 40 is not limited to a trench gate structure, and may have a planar gate structure.

The n-type channel MOSFET is described in the above embodiments, but it is possible to apply the p-type channel MOSFET. It should be noted that the relationship between the gate threshold voltages is reversed in the p-channel MOSFET.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a semiconductor part;
   a first electrode provided on the semiconductor part;
   a second electrode, the semiconductor part being provided between the first electrode and the second electrode; and
   a plurality of control electrodes provided between the semiconductor part and the second electrode, the control electrodes each being electrically isolated from the semiconductor part by a first insulating film, the control electrodes each being electrically isolated from the second electrode by a second insulating film,
   the second electrode including a center portion and a peripheral portion, the peripheral portion being provided at an outer side of the center portion in a direction along a surface of the semiconductor part,
   the semiconductor part including a first region and a second region, the first region being provided between the first electrode and the center portion of the second electrode, the second region being provided between the first electrode and the peripheral portion of the second electrode,
   the control electrodes including first and second control electrodes, the first control electrode being provided between the center portion of the second electrode and the first region of the semiconductor part, the second control electrode being provided between the peripheral portion of the second electrode and the second region of the semiconductor part, the semiconductor part including a first semiconductor layer of a first conductivity type, a first second semiconductor layer of a second conductivity type in the first region, a second second semiconductor layer of the second conductivity type in the second region, a first third semiconductor layer of the first conductivity type in the first region, and a second third semiconductor layer of the first conductivity type in the second region,
   the first second semiconductor layer being provided between the first semiconductor layer and the second electrode, the first second semiconductor layer facing the first control electrode with a first insulating film interposed,
   the second second semiconductor layer being provided between the first semiconductor layer and the second electrode, the second second semiconductor layer facing the second control electrode with another first insulating film interposed,
   the first third semiconductor layer being selectively provided between the first second semiconductor layer and the second electrode, the first third semiconductor layer contacting the first insulating film,
   the second third semiconductor layer being selectively provided between the second second semiconductor layer and the second electrode, the second third semiconductor layer contacting said another first insulating film,
   the first second semiconductor layer including a second conductivity type impurity with a concentration lower than a concentration of a second conductivity type impurity in the second second semiconductor layer.

2. The device according to claim 1, further comprising:
   a connection member provided on the center portion of the second electrode.

3. The device according to claim 1, wherein the second region of the semiconductor part surrounds the first region of the semiconductor part.

4. The device according to claim 1, wherein
   the semiconductor part further includes a third region provided between the first region and the second region, a third second semiconductor layer in the third region and a third third semiconductor layer in the third region, the third third semiconductor layer being provided between the third second semiconductor layer and the second electrode, and the control electrodes include a third control electrode between the third region of the semiconductor part and the second electrode,
   the third second semiconductor layer facing the third control electrode with other first insulating film interposed, the third second semiconductor layer including a second conductivity type impurity with a concentration lower than the concentration of the second conductivity type impurity in the second second semiconductor layer and higher than the concentration of the second conductivity type impurity in the first second semiconductor layer.

5. The device according to claim 4, further comprising:
a connection member provided on the center portion of the second electrode, the connection member being positioned above the first and third regions of the semiconductor part.

6. The device according to claim 1, wherein
the semiconductor part has a plurality of trenches at the second electrode side, and the control electrodes are provided in the plurality of trenches, respectively.

7. The device according to claim 1, wherein
The center portion of second electrode has a square shape extending along the surface of the semiconductor part, and
the second region of the semiconductor part is provided between the first electrode and each of the four corners of the center portion in the second electrode.

8. The device according to claim 1, wherein
the peripheral portion of the second electrode includes a first peripheral portion and a second peripheral portion, the second peripheral portion being spaced from the first peripheral portion, and
the center portion is provided between the first peripheral portion and the second peripheral portion.

9. A semiconductor device comprising:
a semiconductor part;
a first electrode provided on the semiconductor part;
a second electrode, the semiconductor part being provided between the first electrode and the second electrode; and
a plurality of control electrodes provided between the semiconductor part and the second electrode, the control electrodes each being electrically isolated from the semiconductor part by a first insulating film, the control electrodes each being electrically isolated from the second electrode by a second insulating film,
the second electrode including a center portion and a peripheral portion, the peripheral portion being provided at an outer side of the center portion in a direction along a surface of the semiconductor part,
the semiconductor part including a first region and a second region, the first region being provided between first electrode and the center portion of the second electrode, the second region being provided between the first electrode and the peripheral portion of the second electrode,
the control electrodes including first and second control electrodes, the first control electrode being provided between the center portion of the second electrode and the first region of the semiconductor part, the second control electrode being provided between the peripheral portion of the second electrode and the second region of the semiconductor part,
the semiconductor part including a first semiconductor layer of a first conductivity type, a first second semiconductor layer of a second conductivity type in the first region, a second second semiconductor layer of the second conductivity type in the second region, a first third semiconductor layer of the first conductivity type in the first region, and a second third semiconductor layer of the first conductivity type in the second region,
the first second semiconductor layer being provided between the first semiconductor layer and the second electrode, the first second semiconductor layer facing the first control electrode with a first insulating film interposed,
the second second semiconductor layer being provided between the first semiconductor layer and the second electrode, the second second semiconductor layer facing the second control electrode with another first insulating film interposed,
the first third semiconductor layer being selectively provided between the first second semiconductor layer and the second electrode, the first third semiconductor layer contacting the first insulating film,
the second third semiconductor layer being selectively provided between the second second semiconductor layer and the second electrode, the second third semiconductor layer contacting said another first insulating film,
the first insulating film having a first thickness in a direction from the first second semiconductor layer to the first control electrode,
said another first insulating film having a second thickness in a direction from the second second semiconductor layer to the second control electrode, the second thickness being thicker than the first thickness.

10. The device according to claim 9 further comprising:
a connection member provided on the center portion of the second electrode, the connection member being positioned above the first region of the semiconductor part.

11. The device according to claim 9, wherein
the semiconductor part further includes a third region provided between the first region and the second region, a third second semiconductor layer in the third region and a third third semiconductor layer in the third region, the third third semiconductor layer being provided between the third second semiconductor layer and the second electrode, and
the control electrodes include a third control electrode between the third region of the semiconductor part and the second electrode, the third second semiconductor layer facing the third control electrode with other first insulating film interposed,
the other first insulating film having a third thickness in a direction from the third second semiconductor layer to the third control electrode, the third thickness being thinner than the second thickness and thicker than the first thickness.

12. The device according to claim 11, further comprising:
a connection member provided on the center portion of the second electrode, the connection member being positioned above the first and third regions of the semiconductor part.

* * * * *